United States Patent [19]
Lin et al.

[11] Patent Number: 5,852,541
[45] Date of Patent: Dec. 22, 1998

[54] EARLY TRIGGER OF ESD PROTECTION DEVICE BY AN OSCILLATION CIRCUIT

[75] Inventors: Shi-Tron Lin, Hsinchu; Hao-Luen Tien, Taipei; Shyh-Chyi Wong, Taichung, all of Taiwan

[73] Assignee: Winbond Electronics Corp., Hsinchu, Taiwan

[21] Appl. No.: 955,505

[22] Filed: Oct. 22, 1997

[51] Int. Cl.[6] ....................................... H02H 3/22
[52] U.S. Cl. ............................... 361/111; 361/56; 257/355
[58] Field of Search .................... 361/56–58, 91, 361/92, 111, 212, 245; 257/360–363, 355–357

[56] References Cited

U.S. PATENT DOCUMENTS

| | | | |
|---|---|---|---|
| 4,503,448 | 3/1985 | Miyasaka | 357/23 |
| 4,958,121 | 9/1990 | Cuomo et al. | 323/224 |
| 5,218,222 | 6/1993 | Roberts | 257/362 |
| 5,272,371 | 12/1993 | Bishop et al. | 257/362 |
| 5,290,724 | 3/1994 | Leach | 437/51 |
| 5,313,111 | 5/1994 | Walker et al. | 307/296 |
| 5,508,224 | 4/1996 | Jang | 437/60 |
| 5,545,910 | 8/1996 | Jang | 257/362 |
| 5,708,549 | 1/1998 | Croft | 361/56 |

OTHER PUBLICATIONS

A. Amerasekera, et al., Substrate Triggering and Salicide Effects on ESD Performance and Protection Circuit Design in Deep Submicron CMOS Processes, IEDM–95, pp. 547–550.

A. Amerasekera, et al., ESD in Silicon Integrated Circuits, John Wiley & Sons, pp. 40–48 and 68–72.

Primary Examiner—Jeffrey A. Gaffin
Assistant Examiner—Kim N. Huynh
Attorney, Agent, or Firm—Proskauer Rose LLP

[57] ABSTRACT

A transient oscillating circuit is provided to generate a series of current pulses for triggering turn-on of an ESD protection device. As VDD-to-VSS voltage increases rapidly in the initial ESD event, the series of current pulses injects minority carriers into the pwell of an NMOS transistor via an adjacent n+/pwell diode. These minority carriers flow toward the drain-substrate junction of the NMOS transistor such that the NMOS transistor is triggered at a trigger voltage lower than that provided by the prior arts. The present invention improves the ESD performance of an ESD protection device, such as a MOSFET or bipolar transistor, which is provided for protecting the power bus or IC pins during an ESD event.

36 Claims, 5 Drawing Sheets

EARLY TRIGGER OF ESD PROTECTION DEVICE BY AN OSCILLATION CIRCUIT

FIELD OF INVENTION

The present invention relates to ESD protection circuit on a semiconductor device.

BACKGROUND OF THE INVENTION

In order to protect the integrated circuit from damages possibly caused by electrostatic discharge (ESD) event, different efforts have been made by the industries. Transistors, such as grounded-gate NMOS (GGNMOS), gate-coupled NMOS (GCNMOS), field-oxide MOSFET, output buffer transistors, or bipolar transistors, have been commonly used as primary ESD protection elements for integrated circuits. A diode also can be used as an ESD protection device by avalanche breakdown during an ESD event.

For ESD protection of an IC pin or a power bus, GGNMOS (grounded-gate NMOS) or GCNMOS (gate-coupled NMOS) can be used as the primary ESD protection. The drain of the NMOS transistor is connected to VDD or the IC pin, while the source of the NMOS transistor is connected to VSS. The gate is either grounded (GGNMOS), or coupled to VDD by a capacitor and to VSS by a resistor (GCNMOS). A bipolar transistor or other ESD protection circuit can also be used for ESD protection. The VDD to VSS voltage difference may increase rapidly to higher than 10 volts during an ESD event such as the following situations: (i) positive voltage stress of VDD pin to VSS pin, (ii) negative voltage stress of VSS pin to VDD pin, (iii) positive voltage stress on an input or I/O pin while the pin is connected to a pull-up (p+/nwell) diode or a pull-up PMOS, or (iv) negative voltage stress on an input or I/O pin while the pin is connected a pull-down (n+/pwell) diode or a pull-down NMOS.

The ESD protection of a MOSFET (bipolar transistor as well) heavily depends on the triggering of a snap-back mechanism for conducting large amount of ESD current between the drain and source of MOSFET. To start, the high electric field at the drain-substrate junction causes impact ionization with generation of both minority and majority carriers. The minority carriers is collected at the drain (anode), while the majority carriers flow toward the substrate or pwell contact (cathode) causing a local potential build up in the pwell. When the local substrate potential is 0.8V higher than the adjacent n+ source potential, the source-substrate junction becomes forward biased. The forward-biased source-substrate junction injects minority carriers into the pwell. Some of those injected minority carriers are recombined in the substrate while the rest of them reached the drain-substrate junction to further enhance the impact ionization. And due to a continuous loop (positive feedback), the MOSFET gets into a low impedance (snapback) state to conduct large amount of ESD current. As a diode is used as an ESD protection device, the injected minority carriers, when collected in the reverse-biased diode junction during an ESD event, triggers the avalanche breakdown earlier due to carriers multiplication.

In an ESD event, the triggering of an NMOSFET or bipolar ESD protection device is typically initiated by the avalanche breakdown of the reverse-biased diffusion-substrate junction (drain-substrate or collector-substrate junction). The trigger voltage is typically around 12 or 13 volt. It is of great advantage to lower the trigger voltage of a MOSFET (or bipolar transistor) during an ESD event. As the ESD protection occurs sooner, the transient voltage imposed on the I/O and internal circuit is lower which offers better overall ESD protection. When minority carriers (electrons) are present in the reverse-biased diffusion-substrate junction, due to carrier multiplication from impact ionization, the trigger voltage is reduced and the integrated circuit can be better protected in an ESD event.

The prior art, "ESD in Silicon Integrated Circuits" by A. Amerasekera and C. Duvvury, Chap. 3 and Chap. 4, John Wiley & Sons, 1995, hereinafter Ref. 1, describes in details the mechanism of ESD protection circuit. Among prior arts approaches, U.S. Pat. No. 5,366,908 discloses a process for fabricating a MOS device with protection against ESD. The Ref. 1 and U.S. Pat. No. 5,272,371 use a trigger device with a lower trigger voltage than that of the ESD protection device. Once the trigger device reaches avalanche breakdown, lots of carriers are generated and some of them flow in the substrate to induce the trigger of the ESD protection device. Usually, additional implant or a special process recipe is needed, as disclosed in the U.S. Pat. No. 5,272,371, to adjust the trigger voltage of the trigger device, such that it is lower than the trigger voltage of the ESD protection device. The U.S. Pat. No. 5,218,222 discloses another ESD protection circuit which applicable for output and input pins. The U.S. Pat. No. 5,290,724 discloses another process for forming ESD protection circuit. The U.S. Pat. No. 5,508,224 discloses another process for forming ESD protection circuit. The U.S. Pat. No. 5,545,910 discloses another ESD protection circuit. Another prior art "Substrate Triggering and Salicide Effects on ESD Performance and protection Circuit Design in Deep Submicron CMOS Processes" presented by Amerasekera et al. in 1995 IEDM conference paper, lowers the trigger voltage of an ESD protection device by forward biasing a pull-up diode (p+/n-well diode) connected between the input pad and VDD bus. Through the reverse-biased nwell-to-pwell junction, some carriers are collected into the pwell to help triggering the ESD protection device in the pwell. Usually, a method of this nature creates a parasitic SCR (pnpn) path with a reverse-biased nwell/pwell junction, and the latch-up immunity issue therewith needs special design considerations.

U.S. Pat. No. 5,399,928 describes a method of generating negative voltage from a positive voltage source. The negative voltages are typically generated during IC operation and is used for back-bias generator or for the erase operation of Flash memory cells.

SUMMARY OF THE INVENTION

The present invention relates to reduction of the trigger voltage of an ESD protection device through the generation of the negative-voltage pulses during an ESD transient, such as during the positive voltage stress of an IC pin (Input, I/O or VDD pin) to the VSS pin.

In the present invention, a negative pulses with voltage being lower than VSS is generated during a positive-stress, pin-to-VSS (input, I/O or VDD pin) ESD transient. The negative voltage pulses applied to the cathode node of an n+/pwell diode causes forward biasing of the diode and the injection of electrons into the pwell. These injected electrons (minority carriers in the pwell), when collected in the reversed-biased diffusion-substrate junction of the NMOSFET (or bipolar) ESD protection device, reduce the trigger voltage of the ESD protection device.

BRIEF DESCRIPTIONS OF THE APPENDED DRAWINGS

Figure 5A:
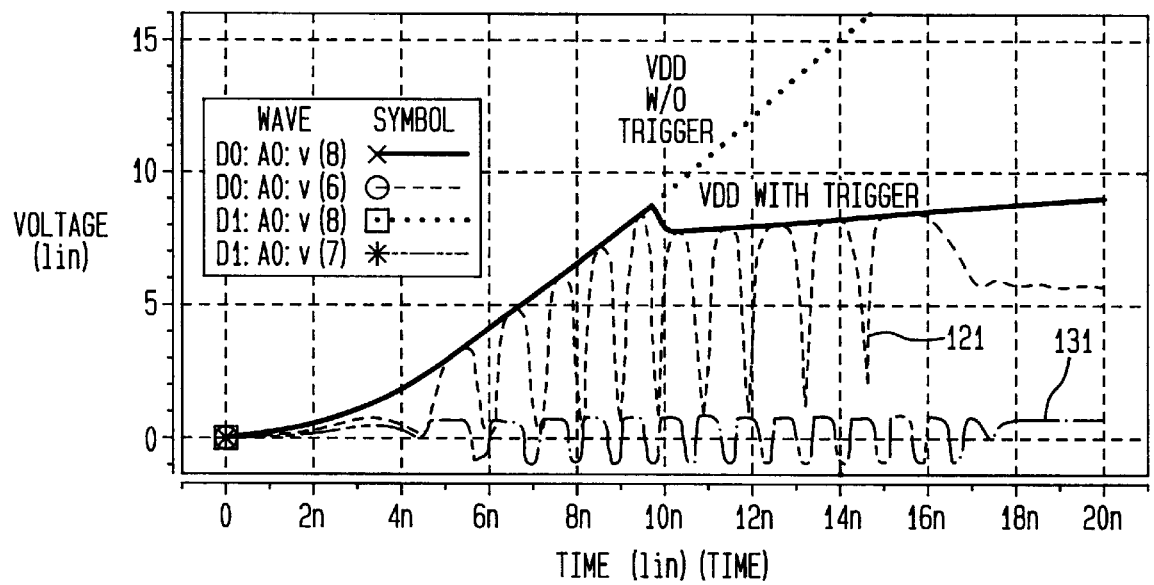

FIG. 5(a), and (b) respectively shows signal variation at respective nodes of the first embodiment of the invention during an ESD event.

Figure 2:
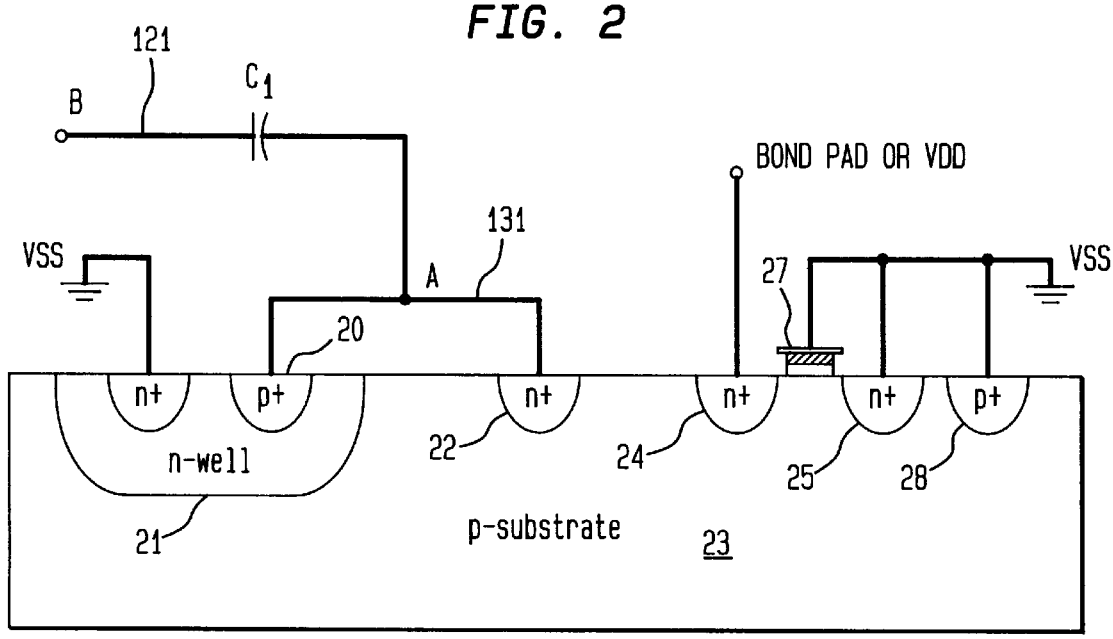
FIG. 2 shows the process technology view of the MOSFET M1, D1 and an adjacent n+/pwell diode D2 of FIG. 1.
Figure 6:
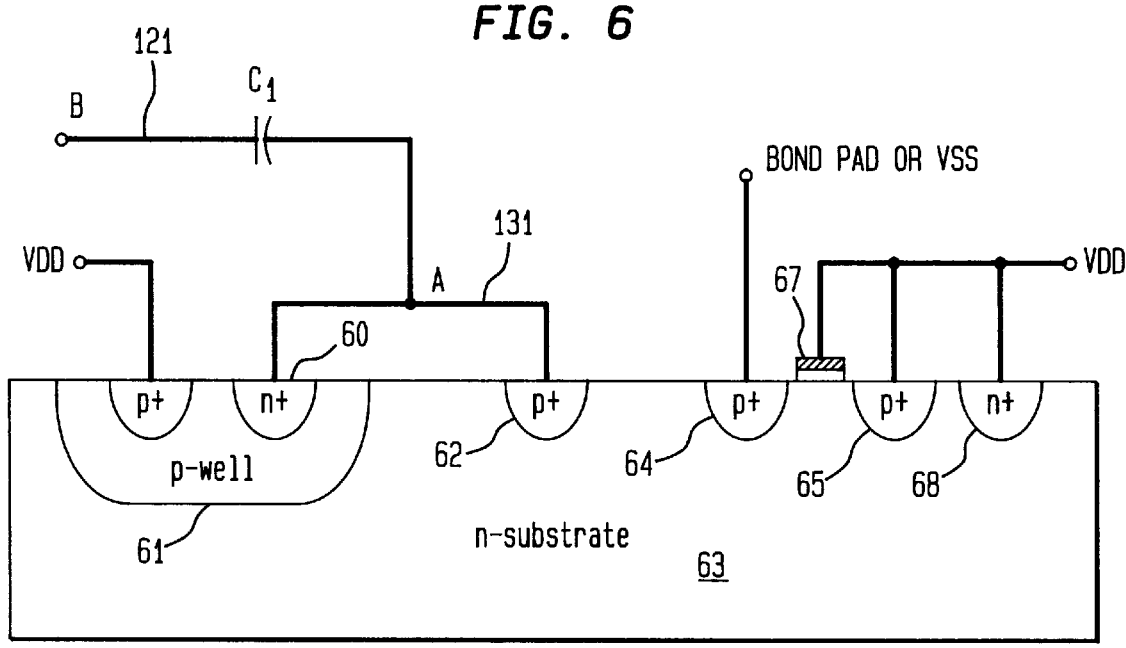

FIG. 6 shows an opposite variation of FIG. 2, in that the n and p type materials are completely reversed.

Figure 7:
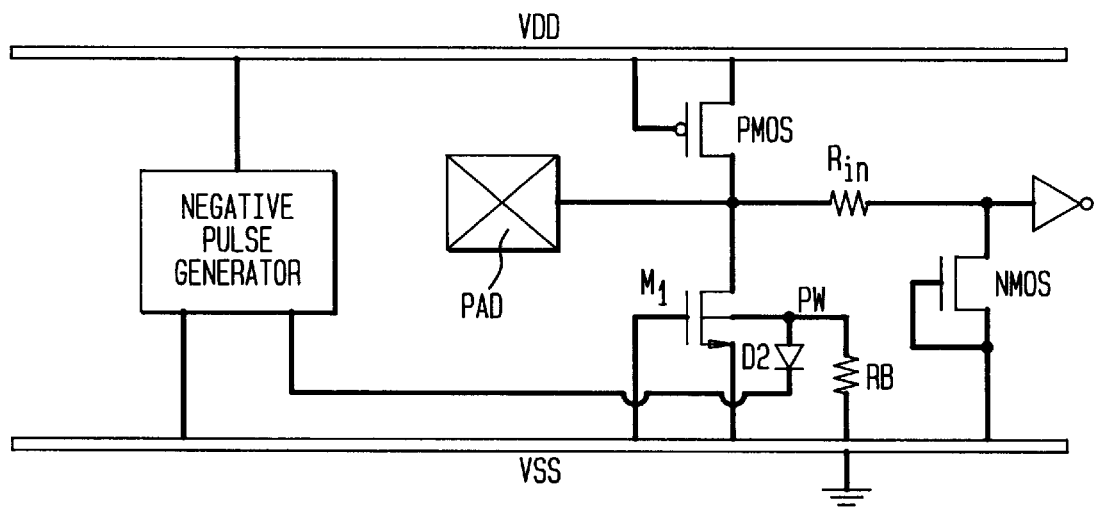

FIG. 7 shows a fourth preferred embodiment of the invention.

Figure 8:
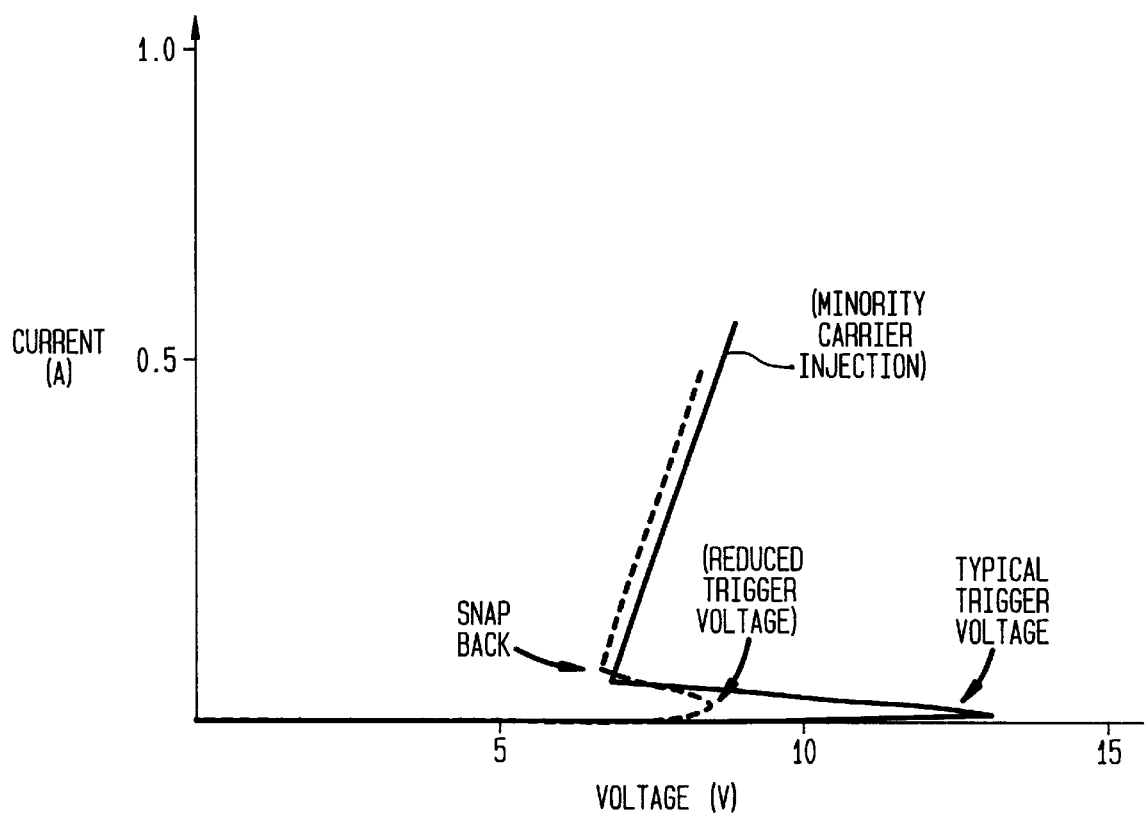

FIG. 8 shows I-V curve of the ESD protection device compared to the conventional approach.

DETAILED DESCRIPTIONS OF THE PREFERRED EMBODIMENTS

Figure 1:
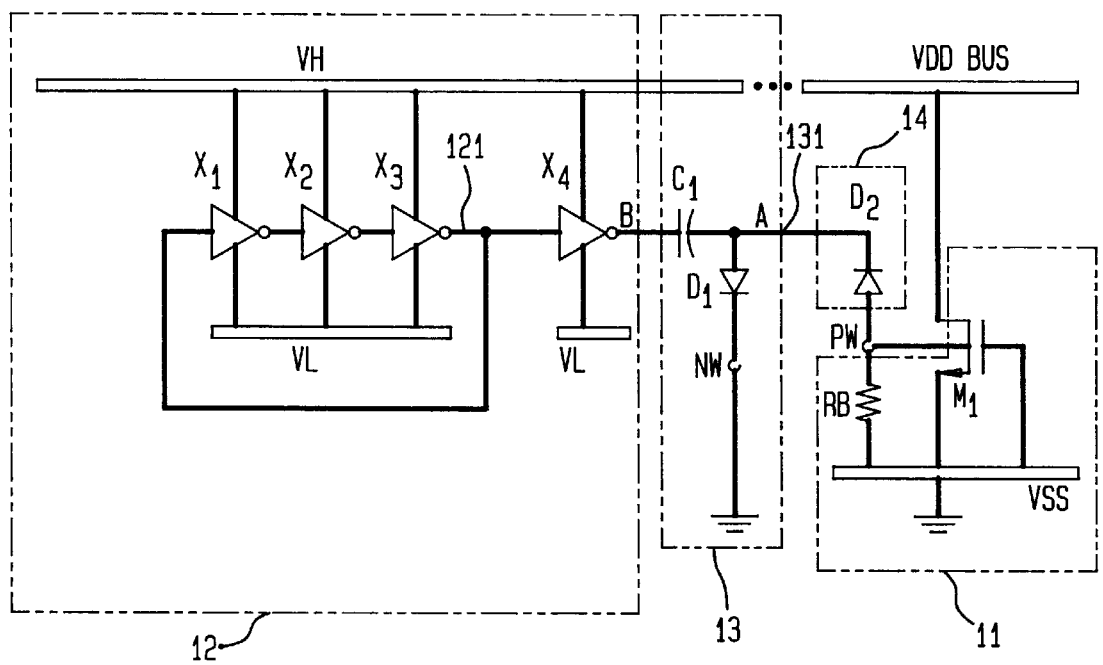
FIG. 1 shows a first preferred embodiment of the invention.

As shown in FIG. 1, the first embodiment of the invention includes an ESD protection circuit 11, an oscillation circuit 12, a pulse generator 13 and a minority-carrier injection circuit 14. The VH of the oscillation circuit 12 is electrically coupled to the VDD bus, or alternatively, electrically coupled to an IC pin via a pull-up device. The VL of the oscillation circuit 12 is electrically coupled to VSS. During a positive VDD-to-VSS or pin-to-VSS ESD event, the voltage difference of the VH and VL of the oscillation circuit 12 increases rapidly along with the ESD transient voltage. As a consequence, the amplitude of the oscillating signal 121 also increases rapidly during the initial ESD transient.

In particular, the oscillation circuit 12 is constituted by a ring oscillator which is a serial connection of an odd number of (at least one) inverters. In shown example, inverters X1, X2, X3 are employed. In a preferred embodiment, an optional buffer X4 may be used to improve the drive strength of the oscillating signal 121.

During an ESD event, the output terminal of the oscillation circuit 12 generates an oscillation signal 121 of a first voltage polarity. The pulse-generator 13 is responsive to the oscillation signal 121 and generates electric pulses 131 of both the first voltage polarity and a second voltage polarity opposite to the first voltage polarity at the node A during the ESD event.

The pulse generator 13 includes a coupling capacitor C1 coupling the oscillating signal 121 to a voltage-clamping device D1, for example, a p+/nwell diode D1 with the nwell tied to VSS. The output signal 131 is therefore clamped to a positive voltage, say, around 0.8 v of the diode-clamping voltage during the upward transition of the oscillating signal 121. On the other hand, the pulses signal 131 goes to a negative-voltage level during the downward transition of the oscillating signal 121, and therefore the pulse generator 13 serves also as a negative-pulse generator during the ESD transient.

The minority-carrier injection circuit 14 has an input terminal adapted to receive the electric pulses 131 and injects minority carriers into the substrate. These minority carriers then triggers the turn-on of the ESD protection circuit 11 to conduct a large current due to the ESD event to Vss. In a preferred embodiment, the minority-carrier injection circuit 14 is a diffusion diode D2 formed by a diffusion n+ region in the p type substrate.

Due to the arrangement of the diode D2, the pulses signal 131 is further clamped to a negative voltage, say, around −0.8 v of the diode-clamping voltage during the downward transition of the oscillating signal 121.

These negative pulses of the signal 131 are used to trigger the ESD protection device 11, i.e. a NMOSFET M1 as shown in FIG. 1, by injecting electrons (minority carriers) into pwell through a n+/pwell junction of the diode D2. The n+ diffusion, pwell, and the reverse-biased diffusion-substrate junction of the NMOSFET M1 form a parasitic (lateral) bipolar transistor, with RB represents the substrate (pwell) resistance. From the parasitic bipolar action and the bipolar gain, part of the injected electrons are collected at the reverse-biased drain-substrate junction of the NMOSFET M1. Due to impact ionization and high electric field in the drain-substrate junction, the minority carriers flow across the drain-substrate junction cause more carrier to be generated. Among those, minority carriers (electrons) are collected by the drain electrode, while majority carriers (holes) flow into the base (pwell or substrate). These carriers flowing in the substrate cause a local-substrate potential to build up, which forward biases the source-substrate junction of the NMOSFET M1 and in return causes more electrons to be injected into the pwell. Thus, through this continuous loop, it quickly leads to the snap-back condition of the NMOSFET M1. As a result, the trigger voltage of the NMOSFET M1 is lowered.

By looking at the FIG. 2 together with FIG. 1, it is seen the p+ diffusion region 20 and nwell 21 constitute the diode D1. The n+ diffusion region 22 and p-substrate 23 constitute the diode D2. The n+ diffusion region 24, the gate 27 and n+ diffusion region 25 constitute the NMOSFET M1. It is also seen that n+/pwell junction diode D2 sits adjacent to M1 with a common grounded p-substrate 23, or, alternatively a pwell.

For the present invention, the latch up is not a concern since the nwell 21 of the p+/nwell diode D1 is grounded and having the same potential as the p-substrate 23 (or pwell). Also, neither additional implant nor process complexity is required.

Further improvement can be made such that the oscillation circuit mentioned above functions only during an ESD event, but not during normal operation nor powering up. This is important for power-saving reason as well as to avoid unwanted triggering of ESD protection circuits during normal IC operation.

Figure 3:
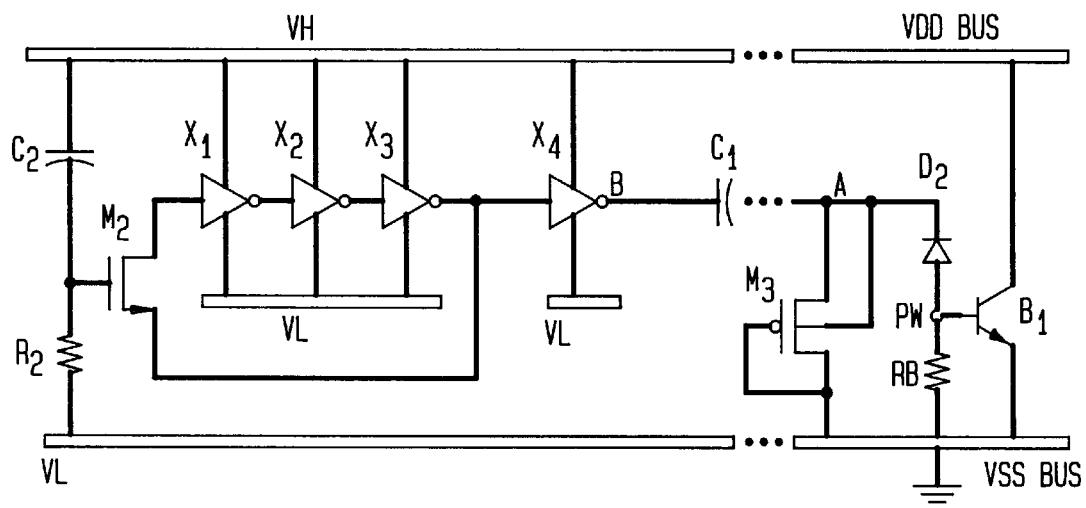
FIG. 3 shows a second preferred embodiment of the invention.

As shown in FIG. 3 and compared with FIG. 1, the invention further includes a delay switch consisting of a switch M2, a capacitor C2 and a resistor R2. The delay switch functions to turn on the oscillation circuit for at least a time period during the ESD event. The delay switch includes a switch M2 having an input node, an output node and a control node, wherein the input node (source) connects to the output terminal of the inverter X3, the output node (drain) connects to an input terminal of the inverter X1. In other words, the delay switch includes an RC circuit which has a resistor R2 and a capacitor C2 with one common joint terminal connected to the control node of the switch M2. The control node of M2 is coupled to VH through the capacitor C2, and coupled to VL through the resistor R2. Among other choices, the R-C time constant may be roughly 20 ns, which enables the oscillator circuit to oscillate for at least around 10 ns, but not much longer than 100 ns, during an ESD transient. Since a powering-up event typically takes longer, or much longer, than micro-seconds, the control node of M2 remains at a much lower voltage than the threshold voltage required to turn on M2. Therefore, the oscillator circuit does not oscillate during normal IC operation or during powering up.

It is shown in FIG. 3, a bipolar device B1 is used as an embodiment for the primary ESD protection device. The triggering mechanism of a bipolar device is the same as that for a MOSFET shown in FIG. 1. In addition, a diode-configured PMOSFET M3 is used as a positive-voltage clamping device instead of the p+/nwell diode D1 of FIG. 1.

It is to be noted that, in another embodiment, M2 can be a PMOSFET with the gate coupled to VH through a resistor and coupled to VL through a capacitor.

Figure 5B:
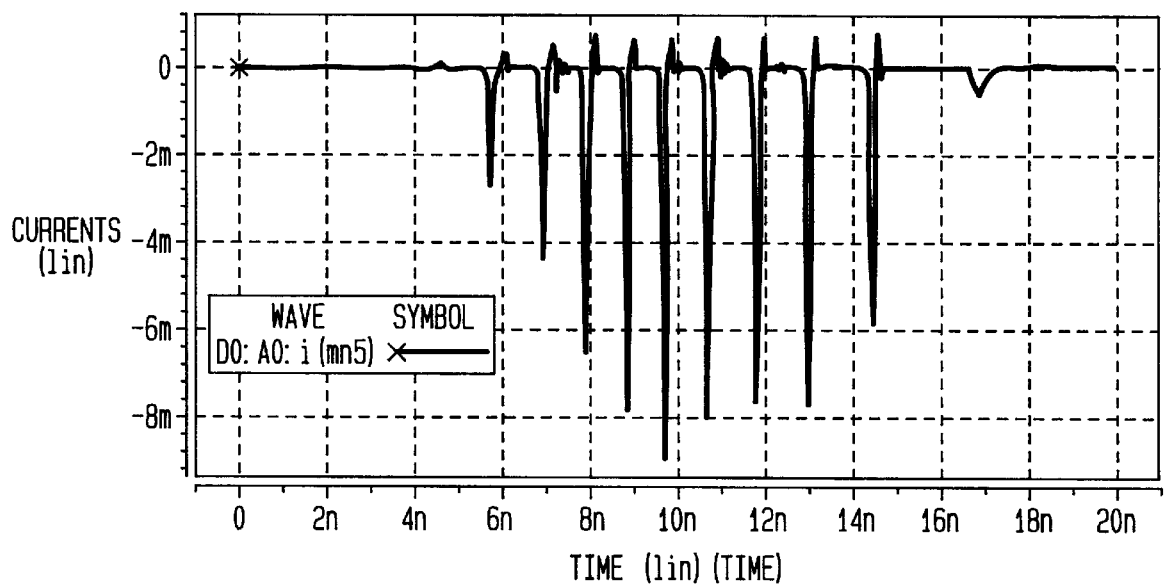

FIG. 5(a), and (b) respectively shows signal variation at respective nodes of the second embodiment of the invention during an ESD event. The simulation results are obtained under conditions of (1) 2.5 KV Human Body Model ESD events; (2) 1 nanoFarad chip capacitance; (3) R2C2=20 nanoseconds, C2=2 pF, R2=10KΩ; (4) C1=0.2 pF. As shown in FIG. 5(a), during the ESD transient, signal 121 oscillates with an increasing amplitude as VDD-to-VSS voltage arises rapidly. The signal 131 also oscillates but pinned at roughly −0.8V to +0.8V due to the diodes D2 and D1. Two Vdd lines are indicated in FIG. 5(a). One (solid line) Vdd line indicates the variation of Vdd when trigger occurs at around 9 volts. Another (dash line) Vdd line indicates the variation of Vdd without trigger of the ESD protection device. It is shown in FIG. 5(B), negative current occurs each time the signal 131 is pinned at −0.8V which enables minority carriers (electrons) to be injected into the p-substrate 23 and the trigger voltage of M1 is lowered. The ESD protection device M1 is triggered when a negative current spike of sufficient magnitude occurs. The larger the negative current spike is, the lower the trigger voltage will be. Since negative pulses can be generated within a few nano-seconds while the rapidly increasing VDD-to-VSS voltage is still less than 10 volt, the trigger voltage of the NMOSFET M1 can be reduced from around 13 volts down to less than 10 volts. In FIG. 5(a) and FIG. 5(b) of the simulation, trigger of the ESD protection device occurs when the fifth negative current spike is generated. Therefore, the ESD protection element as well as the internal circuit of the integrated circuit can be better protected.

As a design example, a capacitance C1 of 0.2 pF can be used which generates negative pulses with roughly 10 mA transient currents for forward biasing the n+/pwell diode D1 during a Human-Body-Model ESD transient. And larger transient current pulses can be generated with a larger C1 accompanied by an adequate driving strength of the buffer X4 and other circuit elements.

Figure 4:
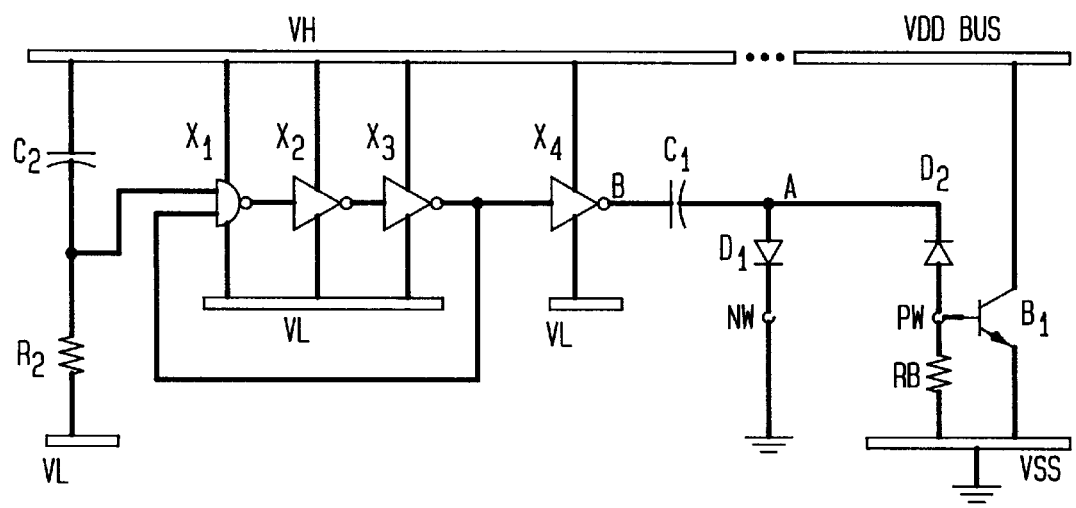
FIG. 4 shows a third preferred embodiment of the invention.

In a third embodiment of the invention shown in FIG. 4, the oscillation circuit includes a NAND gate X1, even number of inverters and an RC circuit. In shown embodiment, two inverters X2, X3 are used. The NAND gate X1 has a first input terminal, a second input terminal and an output terminal. In a general case, N inverters are serially connected to each other, wherein N is an even number, and an output terminal of the last of the N inverters connects to the first terminal of the NAND gate X1. An input terminal of the first of the N inverters connects to the output terminal of the NAND gate X1. The RC circuit has a resistor R2 and a capacitor C2 with one common joint terminal connected to the second input terminal of the NAND gate X1 for terminating the oscillation signal after a time period. The second input of the NAND gate X1 is coupled to the VH through the capacitor C2 and coupled to the VL through the resistor R2. Same as embodiment shown in FIG. 3, the oscillation circuit of this embodiment functions only during an ESD event, but not during normal operation nor powering up.

The fourth preferred embodiment of the invention is shown in FIG. 7, in which the negative pulse generator is powered by VDD and VSS bus, with the VDD bus coupled to an IC pin via a pull-up PMOS device and VSS bus coupled to the IC pin via a pull-down NMOS device. It is to be noted that the negative pulse generator includes functions of oscillation circuit 12 and pulse generator 13 of FIG. 1. The ESD protection device NMOSFET M1 is used to protect an input pin, instead of a power bus, during an ESD event. In other words, this embodiment is applicable for pin-to-Vss ESD event. Alternatively, the primary ESD protection device can be any ESD protection device that has a reverse-biased diffusion-substrate junction in an ESD event. Alternatively, a dedicated bus (sometimes called ESD bus) can be used instead of the VDD bus for powering the negative pulse generator. The positive-voltage clamp device (not shown) can be a p+/nwell diode, a PMOSFET or a NMOSFET with the gate tied to drain. As shown, the negative-voltage clamping device is diode D2. The VH (not shown) of the negative pulse generator can be electrically coupled to an IC pin via a pull-up device, i.e. a p+/nwell diode, a PMOSFET or a pnp transistor.

Although the p-substrate is used an example in the aforesaid preferred embodiments. It is clear that, the spirit of the invention also applies to a n-substrate. FIG. 6 shows an opposite variation of FIG. 2, in that the n and p type materials are completely reversed. Comparing FIG. 2 with FIG. 6, the holes become the minority carriers in the n-substrate. Therefore, during a negative VSS to VDD transient (or positive VDD to VSS transient), when the node B is connected to a transient oscillation circuit like the one shown in FIG. 1, holes are injected into the n-substrate 63 from the node A through the diode constituted by p+ region 62 and n-substrate 63. The injected holes help triggering turn-on of the PMOSFET constituted by the p+ diffusion region 64, the gate 67 and p+ diffusion region 65.

In FIG. 8, comparison of I-V curves of the ESD protection device respectively for the invention and conventional approach is shown. It is seen the trigger voltage for the ESD protection device in the invention is around 9 volts which is substantially lowered than 13 volts for the conventional approach. As a result, the integrated circuit employing the present invention may be better protected during an ESD event.

I claim:

1. An electrostatic discharge (ESD) protection structure for an integrated circuit constructed on a substrate of a first type, comprising:

an ESD protection means constructed on the substrate;

an oscillation means having an output terminal for generating an oscillation signal of a first voltage polarity during an ESD event;

a pulse-generator means, responsive to the oscillation signal, for generating electric pulses including at least pulses of a second voltage polarity opposite to said first voltage polarity during the ESD event;

a minority-carrier injection means, having an input terminal adapted to receive said electric pulses, for injecting minority carriers into the substrate which triggers turn-on of the ESD protection means to conduct a large current due to the ESD event.

2. The structure of claim 1, wherein the oscillation means comprises:

N inverters serially connected to each other to form a ring oscillator, wherein N is an odd number.

3. The structure of claim 2, wherein the oscillation means further comprises a buffer which has an input and an output, the input of the buffer couples to an output terminal of one of said N inverters, the output of the buffer defines the output terminal of the oscillation means, said buffer boosts the driving strength of the oscillation signal during the ESD event.

4. The structure of claim 1, said electric pulses further including pulses of the first voltage polarity, wherein the pulse-generator means comprises:

a capacitive coupling means having a first terminal defining an input terminal of the pulse-generator means, and having a second terminal defining an output terminal of the pulse-generator means;

a voltage clamping means coupled between said output terminal of the pulse-generator means and said substrate, for limiting the electric pulses at the output terminal to a clamping voltage of said first voltage polarity.

5. The structure of claim 1, further comprising a delay-switch means operative to turn on the oscillation means for at least a time period during the ESD event.

6. The structure of claim 5, wherein the oscillation means comprises:

N inverters serially connected to each other, N is an odd number, the last of the N inverters generates the oscillation signal at an output terminal thereof.

7. The structure of claim 6, wherein the delay-switch means comprises:

a switch means having an input node, an output node and a control node, wherein said input node connects to the output terminal of the last of N inverters, said output node connects to an input terminal of the first of N inverters;

a control signal generator for generating a control signal to said control node of the switch means to turn on the switch means for at least a time period during the ESD event.

8. The structure of claim 7, wherein said control signal keeps said switch means off during normal operation of the integrated circuit.

9. The structure of claim 7, wherein said control signal keeps said switch means off during power-on operation of the integrated circuit.

10. The structure of claim 7, wherein said control signal generator includes an RC circuit having a resistor and a capacitor with one common joint terminal generating the control signal.

11. The structure of claim 7, wherein said switch means is a MOSFET transistor, and said control node is a gate of the MOSFET transistor.

12. The structure of claim 1, wherein the oscillation means comprises:

a NAND gate having a first input terminal, a second input terminal and an output terminal;

N inverters serially connected to each other, N being an even number, wherein an.output terminal of the last of the N inverters connects to the first terminal of the NAND gate, an input terminal of the first of the N inverters connects to the output terminal of the NAND gate;

a control signal generator for generating a control signal to said second input terminal of the NAND gate, the control signal selectively enables the switching of said NAND gate, for at least a time period during the ESD event.

13. The structure of claim 12, wherein the control signal selectively keeps said NAND gate in a non-switching state during normal operation of the integrated circuit.

14. The structure of claim 12, wherein the control signal selectively keeps said NAND gate in a non-switching state during power-on operation of the integrated circuit.

15. The structure of claim 12, wherein said control signal generator includes:

an RC circuit having a resistor and a capacitor with one common joint terminal generating the control signal.

16. The structure of claim 4, wherein said voltage clamping means is a diode.

17. The structure of claim 4, wherein said voltage clamping means is a diffusion diode formed by a diffusion region of the first type in a well region of a second type, wherein said well region electrically connects to the substrate.

18. The structure of claim 4, wherein said voltage clamping means is a diode-configured MOSFET.

19. The structure of claim 4, wherein said voltage clamping means is a diode-configured MOSFET inside a well of a second type, wherein a gate and a drain terminal of the MOSFET is electrically connected to the substrate, while a source terminal of the MOSFET and the well of the second type is electrically connected to said output terminal of the pulse-generator means.

20. The structure of claim 1, wherein the ESD protection means is a bipolar transistor.

21. The structure of claim 1, wherein the ESD protection means is a MOSFET transistor.

22. The structure of claim 1, wherein the ESD protection means is a diode.

23. The structure of claim 1, wherein the minority-carrier injection means is a diffusion diode formed by a diffusion region of a second type in the substrate.

24. The structure of claim 23, wherein said diffusion region of the second type is adjacent to a high-electric-field diffusion junction of the ESD protection means, said high-electric-field diffusion junction is reverse biased during the ESD event.

25. The structure of claim 23, wherein the minority carriers are injected into the substrate via the diffusion diode under forward-bias state which is caused by the electric pulse of the second voltage polarity during the ESD event.

26. The structure of claim 25, wherein the minority carriers enhance majority or minority carriers generation caused by impact ionization at the high-electric-field diffusion junction of the ESD protection means, the high-electric-field diffusion junction is reversed-biased during the ESD event.

27. The structure of claim 1, wherein, during the ESD event, an ESD zapping voltage is applied between a VDD pin and a VSS pin.

28. The structure of claim 1, wherein, during the ESD event, an ESD zapping voltage is applied between an IC pin and a power-bus pin.

29. The structure of claim 1, wherein, during the ESD event, an ESD zapping voltage is applied between an IC pin and a VSS bus pin.

30. The structure of claim 29, wherein a VDD power line is connected to said IC pin via a pull up diode, said oscillation means is powered by the VDD and VSS.

31. The structure of claim 29, wherein a VDD power line is connected to said IC pin via a pull up PMOSFET, said oscillation means is powered by the VDD and VSS.

32. A method for triggering an electrostatic discharge (ESD) protection circuit for an integrated circuit constructed on a substrate of a first type, the ESD protection circuit including an ESD protection means constructed on the substrate, comprising the following steps:

generating an oscillation signal of a first voltage polarity during an ESD event;

generating, responsive to the oscillation signal, electric pulses including at least pulses of a second voltage polarity opposite to said first voltage polarity;

applying said electric pulses to a minority-carrier injection means for injecting minority carriers into the substrate which triggers the turn-on of the ESD protection means to conduct a large current due to the ESD event.

33. The method of claim 32, wherein the minority-carrier injection means is a diffusion diode formed by a diffusion region of a second type in the substrate.

34. The method of claim 33, wherein said diffusion region of the second type is adjacent to a high-electric-field diffusion junction of the ESD protection means, said high-electric-field diffusion junction is reverse biased during the ESD event.

35. The method of claim 33, wherein the minority carriers are injected into the substrate via the diffusion diode under forward-bias state which is caused by the electric pulse of the second voltage polarity during the ESD event.

36. The method of claim 35, wherein the minority carriers enhance majority or minority carriers generation caused by impact ionization at the high-electric-field diffusion junction of the ESD protection means, the high-electric-field diffusion junction is reversed-biased during the ESD event.

* * * * *